United States Patent [19]

Schiebold et al.

[11] 4,420,731

[45] Dec. 13, 1983

[54] CONTROLLED VOLTAGE YTTRIUM IRON GARNET (YIG) RESONATOR APPARATUS

[75] Inventors: Cristopher F. Schiebold, Los Altos; William R. Green, La Honda, both of Calif.

[73] Assignee: Watkins-Johnson Company, Palo Alto, Calif.

[21] Appl. No.: 291,618

[22] Filed: Aug. 10, 1981

[51] Int. Cl.³ .......................... H01P 7/00; H01P 5/04; H01P 1/218
[52] U.S. Cl. ................................. 333/219; 333/17 L; 333/202; 333/235
[58] Field of Search ..................... 333/17 L, 202–209, 333/219–223, 227, 231, 245, 248; 328/170, 173

[56] References Cited

U.S. PATENT DOCUMENTS

| | | | |
|---|---|---|---|
| 3,067,394 | 12/1962 | Zimmerman et al. | 328/170 X |
| 3,435,385 | 3/1969 | Cohen | 333/207 |
| 3,448,414 | 6/1969 | Brunton | 333/248 |
| 3,836,875 | 9/1974 | Duncan et al. | 333/17 |

*Primary Examiner*—Marvin L. Nussbaum
*Attorney, Agent, or Firm*—Flehr, Hohbach, Test, Albritton & Herbert

[57] ABSTRACT

A controlled voltage yttrium iron garnet (YIG) resonator incorporates a clipping diode in order to maintain a constant output voltage. The clipping diode is connected either across an input or an output loop associated with the resonator. The resonator, as a result of its high Q characteristic, is insensitive to changes in capacitance of the clipping diode.

4 Claims, 7 Drawing Figures

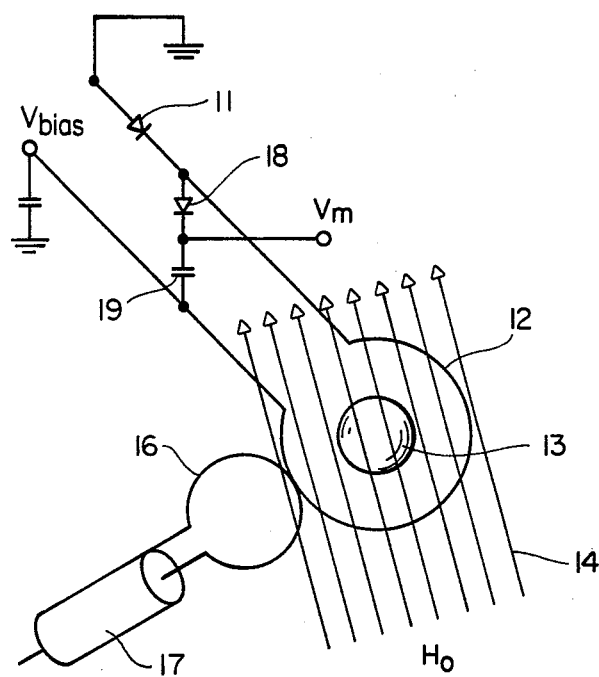
FIG_1
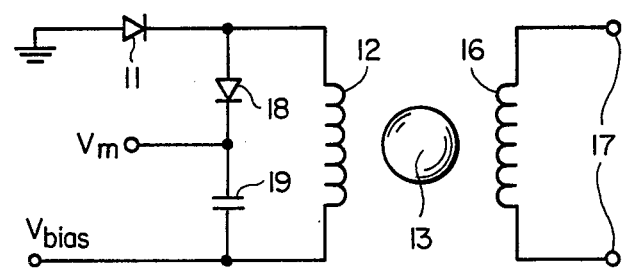
FIG_2

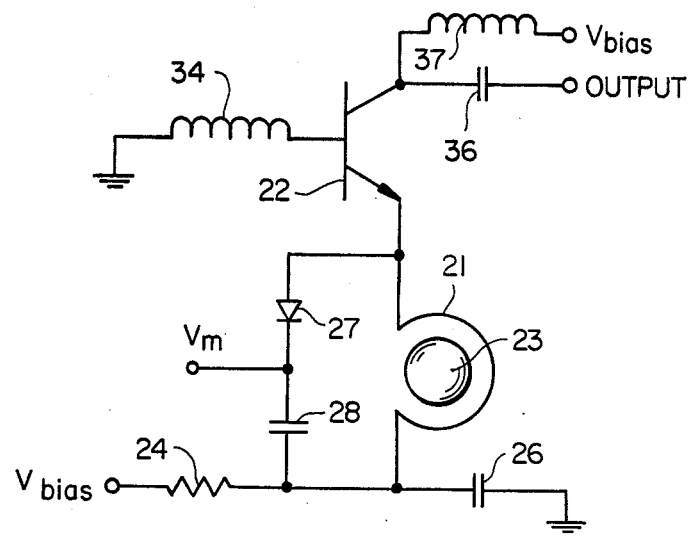
FIG_3
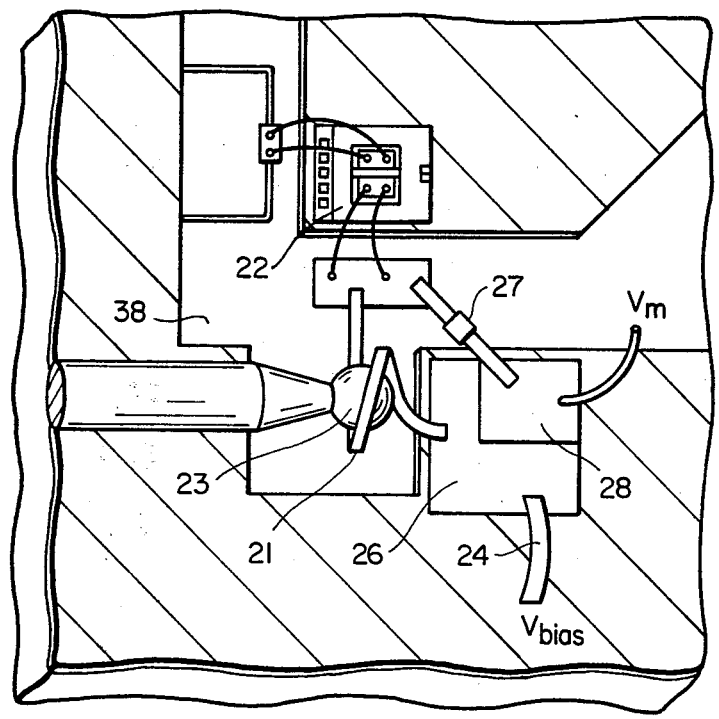
FIG_4

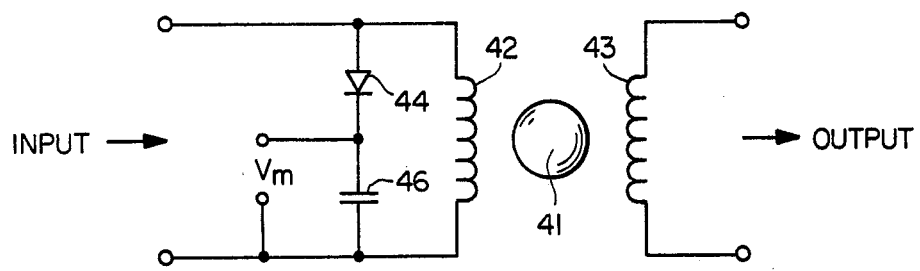
FIG_5
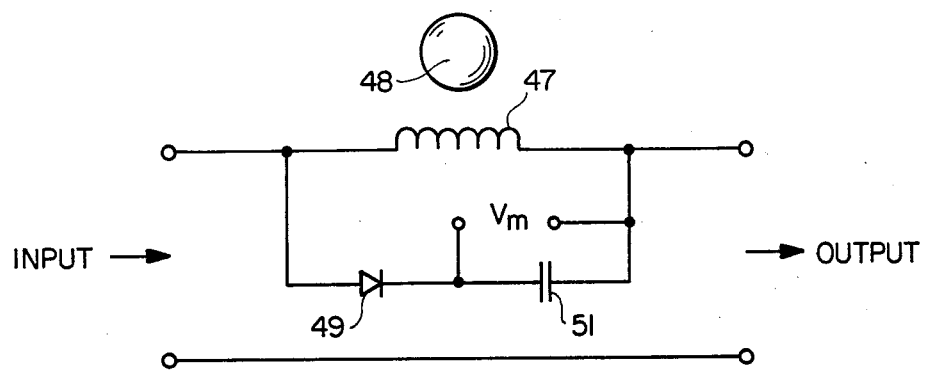
FIG_6
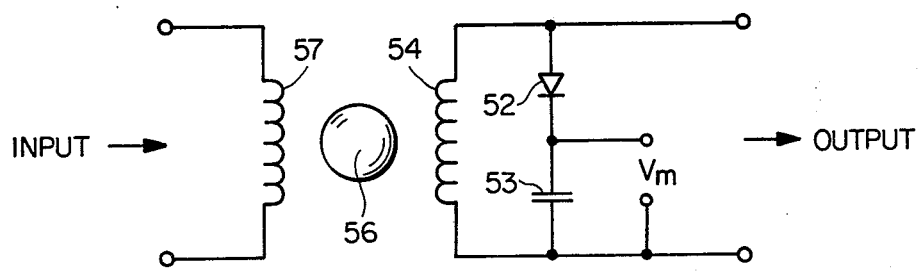
FIG_7

CONTROLLED VOLTAGE YTTRIUM IRON GARNET (YIG) RESONATOR APPARATUS

This invention relates generally to YIG resonators and more particularly to a controlled voltage YIG resonator for use in YIG oscillators, filters, and other YIG tuned devices.

It is known to control the voltage across an LC tuned circuit by the use of a diode clipping circuit connected across the LC tuned circuit. The disadvantage of this voltage control technique is that the diode possesses a voltage dependent capacitance and any change in diode voltage (capacitance) will result in a change in the resonant frequency of the tuned circuit. At lower frequencies this change is negligible because the change in capacitance is small relative to the circuit capacitance. At higher frequencies, however, where tuned circuit capacitance is small the diode capacitance has a pronounced effect on the resonant frquency. Consequently, the diode clipping technique has not been employed at high frequencies.

YIG oscillators and other YIG tuned devices have traditionally had their power (voltage) outputs controlled with separate PIN diode networks. Attenuation is achieved by varying the RF resistance of a PIN diode in the output circuit, causing a mismatch, and correspondingly less power (voltage) delivered to the load. Attenuating PIN diode networks have inherent problems in their operation: mismatches are generated as power is attenuated; noise and harmonic levels are increased; and, the range of attenuation is limited. Furthermore, circuitry used in conjunction with attenuating PIN diode networks limits bandwidth, increases complexity, and adds significantly to overall cost and size.

We have discovered that the incorporation of a diode clipping circuit in a YIG resonator provides a means for YIG voltage amplitude control and modulation up through and above microwave frequencies. We have also discovered that due to the unique nature of YIG resonators the resonant frequency is insensitive to changes in capacitance of the clipping diode.

It is an object of the present invention to provide an improved controlled voltage yttrium iron garnet YIG resonator.

It is another object of the present invention to provide a controlled voltage yttrium iron garnet resonator for use in YIG oscillators, YIG filters, and other YIG tuned devices.

It is a further object of the present invention to provide a voltage controlled YIG resonator which is inexpensive and simple in construction.

It is still a further object of the present invention to provide a voltage controlled YIG resonator which reduces noise and harmonics as voltage is attenuated.

The foregoing and other objects are achieved by a YIG resonator comprising a YIG sphere, an input coupling loop coupled to said sphere, and a diode coupled across to the resonator to limit the maximum voltage developed thereacross.

The invention will be more clearly understood from the following description taken in connection with the following drawings of which:

FIG. 1 is a schematic view of the YIG tuned Gallium Aresenide oscillator.

FIG. 2 is a schematic circuit diagram of the YIG oscillator of FIG. 1.

FIG. 3 is a schematic diagram of another YIG oscillator embodying the present invention.

FIG. 4 is a perspective view of the YIG oscillator shown in FIG. 3.

FIG. 5 is a schematic view of a YIG tuned band pass filter incorporating the present invention.

FIG. 6 is a schematic diagram of a band reject YIG filter incorporating the present invention.

FIG. 7 is a schematic diagram of another YIG resonator device.

Referring to FIG. 1 a YIG tuned Gallium Arsenide oscillator is shown as including a Gallium Arsenide diode 11 connected in series with an input coupling loop 12 which couples energy to the YIG sphere 13. A DC magnetic tuning field $H_0$ shown by the arrows 14 determine the resonant frequency of the YIG oscillator. An output loop 16 is coupled to provide signal voltages on the co-axial cable 17. The loop 16 is orthogonal to the loop 12 to be developed therefrom. The schematic diagram of FIG. 2 bears like reference numerals for like parts.

YIG tuned semi-conductor oscillators and their operations are well known. In essence the frequency of oscillation is determined by the tunable resonance characteristics of the YIG sphere in which the tuning frequency is controlled by the applied DC magnetic field. Since no harmonic resonance is generated as in transmission line or lump constant resonators very broad tuning ranges can be achieved. The tuning property of the YIG material is superior to other tuning devices because of its low loss, high Q performance at microwave frequencies. In general the operation of the YIG resonator can be explained in terms of spinning electrons that create a magnetic moment in each molecule within the crystal. Application of an external DC magnetic field causes the magnetic dipoles to align themselves in the direction of the field producing a strong magnetization. Any magnetic force at right angles to the field results in precession of the dipoles around the field. The rate of frequency of precession depends upon the strength of the magnetic field and to a degree on the properties of the YIG material. Generally, the output voltage varies with frequency. It is desirable not only to be able to maintain a constant output voltage but also to have control of the voltage amplitude.

In accordance with the present invention we have discovered that by coupling a clipping diode to the YIG resonator it is possible to limit the voltage. However, because of the high Q characteristics of the YIG sphere there are no perturbations of the frequency and the output signal remains sinusoidal.

Referring particularly to FIGS. 1 and 2 there is shown, connected in shunt with the YIG resonator comprising the input loop 12 and YIG sphere 13, the series combination of a clipping diode 18 and by-pass capacitor 19. A modulating control or DC voltage $V_m$ is applied to the common terminal of the diode and capacitor. By selecting the voltage $V_m$ the clipping diode will go into conduction at a predetermined voltage determined by the breakdown voltage of the diode and the voltage $V_m$. This limits the amplitude of the RF voltage across the loop thereby limiting the voltage on the output loop 16 and at output line 17.

FIGS. 3 and 4 show another oscillator incorporating the present invention. The oscillator includes a coupling loop 21 in the emitter circuit of transistor 22 coupled to YIG sphere 23. Bias voltage is applied to the emitter through resistor 24 which is bypassed by capacitor 26, and to the collector through inductor 37. The voltage controlled clipping circuit includes clipping diode 27 and capacitor 28. Control voltage $V_m$ is applied at the common junction of the diode 27 and capacitor 28. Feedback signals are obtained at the base of transistor 22 through inductor 34. The oscillator output is obtained from the collector through the capacitor 36. As before the amplitude of the output voltage is fixed by the bias on the diode 27 which limits the voltage amplitude on the loop 21 and in turn the voltage at the output.

The circuit of FIG. 3 is shown in a thin-film configuration in FIG. 4. The darkened areas represent metalization on the insulating substrate 38. The components bear the same numbers as in FIG. 3.

FIG. 5 shows a band pass filter including a YIG sphere 41, input loop 42, and output loop 43. The voltage amplitude is controlled by diode 44 and variable voltage $V_m$.

FIG. 6 shows a band reject filter with a series coupling loop 47 coupled to YIG sphere 48. Output voltage control is by the diode 49 and variable voltage $V_m$.

FIG. 7 shows another band pass filter. In this filter the voltage control diode 52 and bypass capacitor 53 are connected across the output loop 54 coupled to YIG sphere 56. Input loop 57 is also coupled to the YIG sphere. This shows that the clipping diode can be connected across either the input or output loop of the YIG resonator.

Thus, there has been provided an improved YIG resonator in which the RF voltage is controlled by a clipping diode and a control voltage.

What is claimed :

1. A controlled voltage YIG resonater comprising a YIG sphere, an input coupling loop coupled to said sphere, means providing a magnetic field to said YIG sphere, and a diode coupled to said resonator to limit the voltage developed across the resonator, said diode operating as a voltage clipping device which does not significantly detune the resonator.

2. A controlled voltage YIG resonator as in claim 1 in which said diode is connected across said coupling loop.

3. A controlled voltage YIG resonator as in claim 1 including an output loop coupled to said YIG sphere for providing the output voltage.

4. A controlled voltage YIG resonator as in claim 3 in which said diode is connected across said output loop.